(12) United States Patent
Khanna et al.

(10) Patent No.: US 6,393,514 B1
(45) Date of Patent: May 21, 2002

(54) METHOD OF GENERATING AN ALMOST FULL FLAG AND A FULL FLAG IN A CONTENT ADDRESSABLE MEMORY

(75) Inventors: Sandeep Khanna, Santa Clara; Varadarajan Srinivasan, Los Altos Hills; Bindiganavale S. Nataraj, Cupertino, all of CA (US)

(73) Assignee: NetLogic Microsystems, Inc., Mountain View, CA (US)

( * ) Notice: Subject to any disclaimer, the term of this patent is extended or adjusted under 35 U.S.C. 154(b) by 0 days.

(21) Appl. No.: 09/351,545

(22) Filed: Jul. 12, 1999

(51) Int. Cl.[7] .............................................. G06F 12/00
(52) U.S. Cl. ......................................... 711/108; 710/57
(58) Field of Search .............................. 711/108; 710/57

(56) References Cited

U.S. PATENT DOCUMENTS

| | | | | |
|---|---|---|---|---|
| 5,249,271 A | * | 9/1993 | Hopkinson et al. ............ 710/57 |
| 5,347,648 A | * | 9/1994 | Stamm et al. .................. 714/5 |
| 5,406,279 A | * | 4/1995 | Anderson et al. ............. 341/51 |
| 5,440,715 A | * | 8/1995 | Wyland ....................... 395/435 |
| 5,440,753 A | * | 8/1995 | Hou et al. .................... 711/108 |
| 5,454,094 A | * | 9/1995 | Montove ..................... 711/108 |
| 5,539,882 A | * | 7/1996 | Gopal et al. ............. 395/200.1 |
| 5,893,931 A | | 4/1999 | Peng et al. ................. 711/206 |
| 6,076,137 A | * | 6/2000 | Asnaashari .................. 711/103 |
| 6,195,277 B1 | * | 2/2001 | Sywyk et al. .................. 365/49 |
| 6,249,450 B1 | * | 6/2001 | Tanaka et al. ................. 365/49 |

OTHER PUBLICATIONS

Preliminary Data Sheet, GEC Plessey Semiconductors, Feb. 1997, pp. 1–15.

* cited by examiner

Primary Examiner—Matthew Kim
Assistant Examiner—Pierre M. Vital
(74) Attorney, Agent, or Firm—William L Paradice, III (57) ABSTRACT

An almost full flag is asserted when all but one of the rows of a CAM array contain valid data, as indicated by corresponding valid bits. In one embodiment, the almost full flag is generating using match logic and multiple match logic, where the match logic asserts a first signal when at least one of the CAM rows contains invalid data, and the multiple match logic asserts a second signal when more than one CAM row contains invalid data. The almost full flag is asserted when the first asserting is asserted indicating there is at least one available row and the second signal is de-asserted indicating there is no more than one available row. Thus, when asserted, the almost full flag indicates that there is only one available CAM row. Subsequent instructions are monitored to detect an instruction which calls for writing valid data to the one available CAM row. The full flag is asserted when such an instruction is detected while the almost full flag is asserted.

38 Claims, 6 Drawing Sheets

METHOD OF GENERATING AN ALMOST FULL FLAG AND A FULL FLAG IN A CONTENT ADDRESSABLE MEMORY

BACKGROUND

1. Field of Invention

This invention relates generally to content addressable memories and specifically to a full flag condition in a content addressable memory.

2. Description of Related Art

A content addressable memory (CAM) includes an array of memory cells arranged in a matrix of rows and columns. Each memory cell stores a single bit of digital information. The bits stored in a row of memory cells in the CAM array constitute a CAM word. During compare operations, a comparand word is received at appropriate input terminals of the CAM and then compared to all the CAM words. For each CAM word that matches the comparand word, a corresponding match line signal is asserted to indicate a match condition. The matching CAM word is then read from the CAM.

Figure 1:
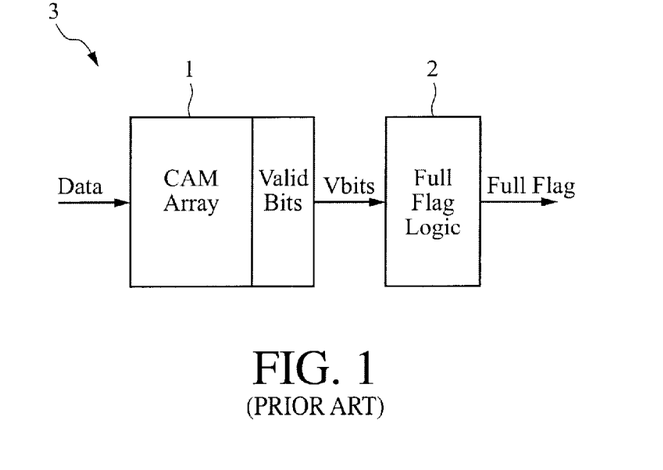
FIG. 1 is a block diagram of conventional CAM having a CAM array and associated full flag logic.

FIG. 1 shows a portion of a CAM device 3 that includes a CAM array 1 and associated full flag logic 2. Each row of the CAM array 1 includes an additional memory cell for storing a valid bit indicative of whether a valid word is presently stored in that row. Since the CAM array is initially undefined, all valid bits are initially de-asserted to indicate that there are no valid words stored in the array. In connection with each write operation in which valid data is written to a selected row of the CAM array 1, the valid bit corresponding to the selected row is asserted, thereby indicating that valid data is stored in the selected row. Words stored in the CAM array 1 are invalidated by de-asserting corresponding valid bits. The valid bits are provided to the full flag logic 2 which, in response thereto, generates a full flag for the CAM array 1. The full flag is asserted when all the valid bits are asserted, i.e., when all rows of the CAM array 1 contain valid data.

Figure 2:
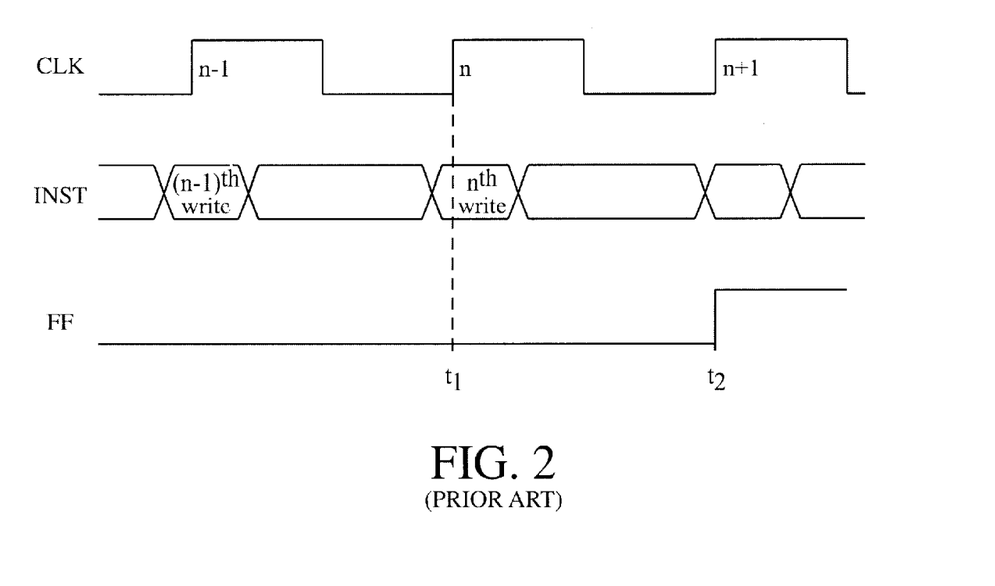
FIG. 2 is a simplified timing diagram illustrating write operations of the CAM of FIG. 1.

FIG. 2 is a timing diagram illustrating write operations to the last two available rows (i.e., those that don't contain valid data) of CAM array 1, where the CAM array 1 has n rows. Each write instruction is latched into the CAM 3 on a rising edge of clock signal CLK and causes valid data to be subsequently written to a selected CAM row. The corresponding valid bit is then asserted.

Referring to FIG. 2, the $n^{th}$ write instruction latched at time t causes valid data to be written to the last available row of the CAM array 1. In connection with this write operation, the valid bit corresponding to the last available row is asserted. Thereafter, all valid bits are logically combined by full flag logic 2 to assert, after some gate delay, the full flag FF at time $t_2$. Thus, the full flag signal cannot be asserted to a logic high state until after the valid bit is resolved at the $n^{th}$ row of CAM array 1. It is not desirable to have the full flag signal be asserted too close to the end of the $n^{th}$ clock cycle as this may not leave enough set-up time relative to CLK for a follow-on device that uses the full flag signal. If the full flag is not asserted until the last valid bit is asserted in response to the nth write, this may result in an undesirable need either to push out the clock timing to accommodate the full flag, or to have the follow-on device wait an extra clock cycle to latch the full flag. Either of these two results can degrade system performance for a system including CAM 3.

Thus, it would be desirable to decrease the time delay between receiving the write instruction which causes valid data to be written to the last available CAM row and assertion of the full flag.

SUMMARY

In accordance with one embodiment of the present invention, an almost full flag is asserted when all but one of the rows of a CAM array contain valid data, as indicated by corresponding valid bits. Subsequent instructions are then monitored to detect an instruction which causes valid data to be written to the one available CAM row. The full flag is asserted when such an instruction is detected while the almost full flag is asserted. Thus, present embodiments do not need to use the last valid bit to generate the full flag, but rather can combine the almost full flag with information from subsequent instruction bits to generate the full flag. Accordingly, present embodiments do not need to wait until after the last valid bit is asserted to correctly determine the state of the full flag. As a result, present embodiments may assert the full flag sooner than prior art techniques allow.

BRIEF DESCRIPTION OF THE DRAWINGS

Like reference numerals refer to corresponding parts throughout the drawing figures.

DETAILED DESCRIPTION

Present embodiments are discussed below in the context of a CAM architecture 10 for simplicity only. It is to be understood that present embodiments are equally applicable to CAM structures of other sizes and configurations. Further, present embodiments are applicable to other types of memory such as, for instance, EPROM, EEPROM, DRAM, SRAM, SDRAM, Flash, and so on. In addition, the particular logic levels assigned to signals discussed herein is arbitrary and, thus, may be reversed where desirable. Accordingly, the present invention is not to be construed as limited to specific examples described herein but rather includes within its scope all embodiments defined by the appended claims.

Figure 3:
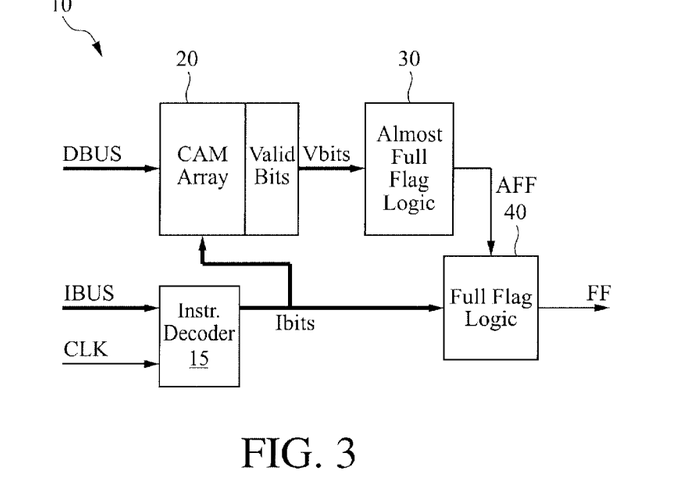
FIG. 3 is a block diagram of a CAM in accordance with one embodiment of the present invention.

FIG. 3 shows a CAM architecture 10 including an instruction decoder 15, an n-word CAM array 20, an almost full flag logic circuit 30, and a full flag logic circuit 40. The instruction decoder 15 decodes instructions received from the instruction bus IBUS and, in response thereto, provides control signals to CAM array 20 (via write and/or read circuitry not shown) and one or more instruction bits (Ibits) to the full flag logic circuit 40. Data is provided to the CAM array 20 via a data bus DBUS and may be stored in a register (not shown).

The CAM array 20 includes an additional column of memory cells for storing n valid bits corresponding to the n CAM rows. Each valid bit indicates whether a valid word is stored in the corresponding row of the array 20. Upon reset or power-up, the valid bits are initially de-asserted so as to indicate that the CAM array 20 is empty, i.e., that none of the rows contain valid data. When a word is written to a row of the CAM array 20, the corresponding valid bit may be asserted in a well-known manner to indicate that the row contains valid data and is thus no longer available. In some embodiments, each row of the CAM array 20 may include two or more valid bits to distinguish between an empty row and a row which contains invalid data (and may indicate other states such as, for instance, a skip state).

The valid bits (Vbits) are provided to the almost full flag logic circuit 30 after every write operation of the CAM array 20. The almost full flag logic circuit 30 logically combines the Vbits, and asserts an almost full flag (AFF) when the Vbits indicate that all but one of the rows of the CAM array 20 contain valid data. Thus, when asserted, the AFF indicates that only one row of the CAM array 20 contains invalid data (i.e., is available).

The AFF signal may be used internally within CAM 10. It may also be output from CAM 10 as an external signal. When AFF is output as an external signal, it may be used by a follow-on device or system incorporating CAM 10 to predict a subsequent full condition, or to stop full writes to CAM array 20. This may increase system performance over waiting for the full flag signal FF to be asserted.

The full flag logic circuit 40 generates the full flag signal FF in response to one or more Ibits received from the instruction decoder 15 and the AFF from the almost full flag logic circuit 30. The Ibits indicate whether the decoded instruction is a write instruction. The full flag logic circuit 40 asserts the FF when (1) the AFF is asserted and (2) the next write instruction calls for writing valid data to the last available address. In other words, when AFF is asserted indicating that there is only one row of the CAM array 20 available, and the last write instruction calls for writing valid data to that row, the full flag logic circuit 40 asserts the FF to indicate that the CAM array 20 is full. By monitoring the instructions provided to the CAM 10 as opposed to the Vbit associated with the last available row, CAM 10 may generate the FF faster than the CAM device of FIG. 1. That is, in contrast to prior art techniques which need all the valid bits to generate the full flag, present embodiments may overlap the gate delay associated with logically combining a large number of valid bits with execution of the instruction which writes valid data to the last available CAM row. As a result, CAM 10 may provide a performance advantage over prior art techniques of generating a full flag signal.

In one embodiment, the full flag logic circuit 40 may be an AND gate having a first input coupled to receive the AFF from the almost full flag logic circuit 30 and a second input coupled to receive one or more Ibits from the instruction decoder 15, in which case the FF is asserted if the AFF and an Ibit are both asserted. In this embodiment, the Ibit indicates whether the corresponding instruction causes valid data to be written to the last available row. In other embodiments, the full flag logic circuit 40 may include any appropriate logic gates to generate the appropriate logic state of FF in response to the logic states of the AFF and the Ibits(s).

Figure 4:
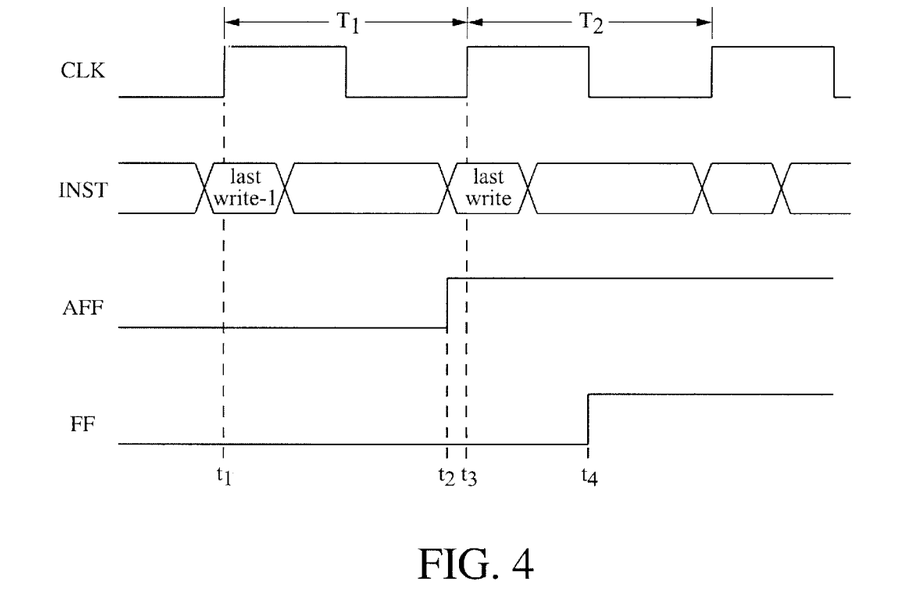
FIG. 4 is a timing diagram illustrating write operations of one embodiment of the CAM of FIG. 3.

FIG. 4 shows one example of a timing diagram illustrating a write operation to the last two available rows of the CAM array 20. Each write instruction is latched into CAM 10 on the rising edge of a clock signal CLK, and is decoded by instruction decoder 15. At time $t_1$, an instruction is provided on the IBUS that causes valid data to be written into and/or stored in the next-to-last available row of CAM array 20. The Vbit corresponding to this next-to-last row is asserted in response to this write operation. The Vbits are logically combined by the almost full flag logic circuit 30 to generate the AFF. Here, since all but one of the Vbits are asserted, the AFF is asserted to a logic high state at time $t_2$. On the next rising edge of the CLK at time $t_3$, an instruction is provided on the IBUS that causes valid data to be written into and/or stored in the last available row of the CAM array 20, and also causes Ibits to be provided to the full flag logic circuit 40. In response to the Ibits and the AFF, which together indicate that the instruction calls for writing valid data to the last available CAM row, the full flag logic circuit 40 asserts the FF to logic high at time $t_4$.

The FF signal is asserted earlier in clock cycle T2 than that provided by CAM device 3 of FIG. 1. The FF signal is generated earlier in the clock cycle because CAM 10 determines the almost full condition of CAM array 20 and monitors instructions that will cause CAM array 20 to be full. Accordingly, the FF may be asserted without having to wait for all the Vbit states to be resolved in response to the instruction that results in a full CAM array 20. When the FF signal is generated earlier in the clock cycle, it increases the likelihood that set-up times relative to the next rising edge of CLK are sufficient for follow-on devices monitoring the full flag FF. This can increase system performance over systems that must either wait an additional clock cycle to latch the FF, or cause the clock cycle times (e.g., T1 and T2) to be pushed out to accommodate the FF signal generation. In some embodiments, the FF signal may be asserted in the last write cycle approximately 25% to 75% faster than that of CAM device 3 of FIG. 1.

In one embodiment, where CLK has a period of 30 ns, the time lapsed between time $t_3$ (the rising CLK edge which latches the instruction which causes valid data to be written to the last available CAM row) and time $t_4$ (the assertion of the FF) is approximately 15 ns, i.e., $t_4-t_3=15$ ns. In comparison, CAM device 3 of FIG. 1 may generate a full flag signal (using a similar process technology) in approximately 22 ns (i.e., $t_2-t_1=22$ ns in FIG. 2). Thus, for this example CAM 10 may assert the FF approximately 7 ns sooner than the prior art technique described above with respect to FIGS. 1 and 2.

Figure 5:
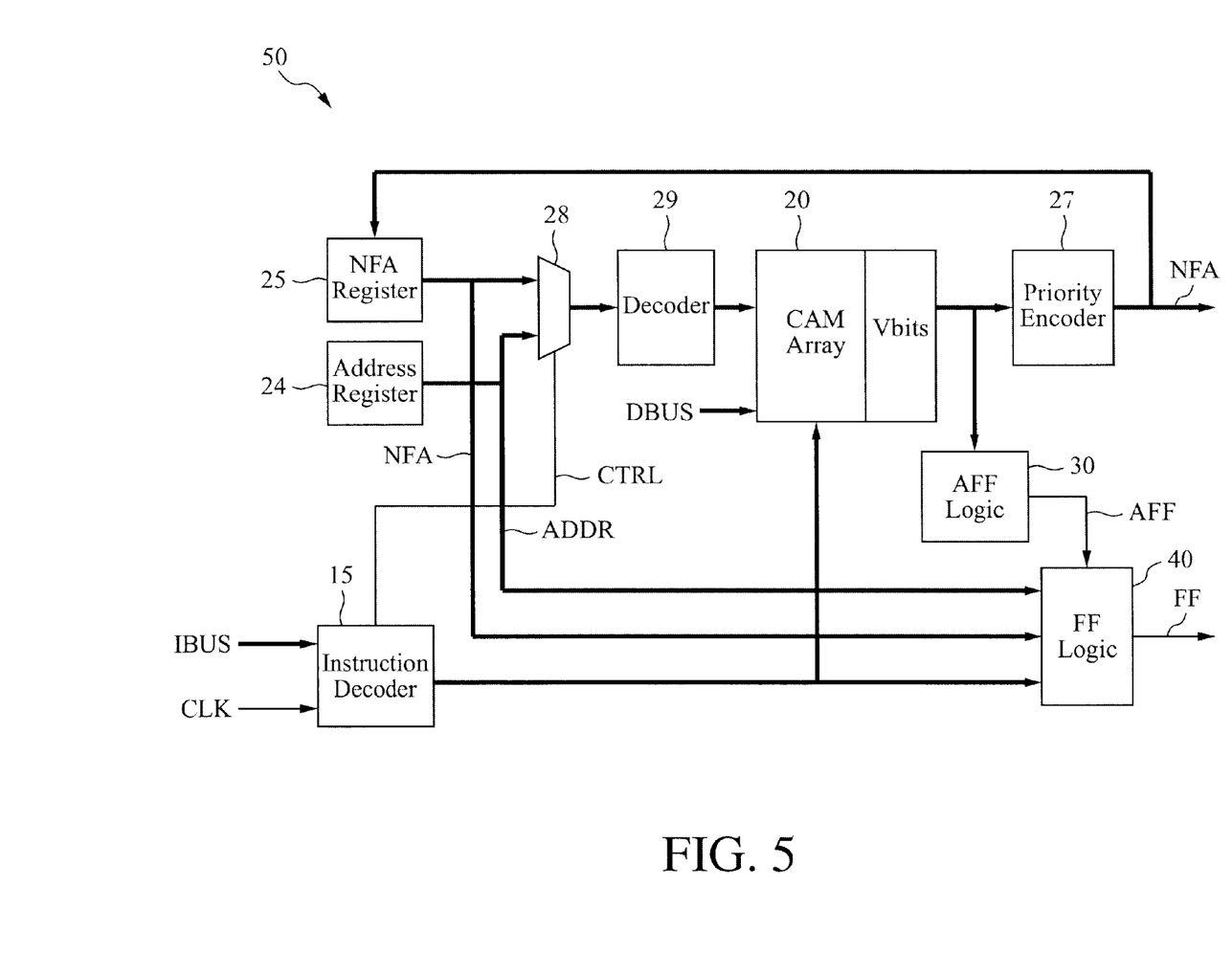
FIG. 5 is a block diagram of a CAM including an almost full flag logic circuit and a full flag logic circuit in one embodiment of the CAM of FIG. 3.

FIG. 5 shows a CAM architecture 50 that is one embodiment of the architecture 10 of FIG. 3. The architecture 50 includes an address register 24, an NFA register 25, a priority encoder 27, a multiplexer (MUX) 28, and an address decoder 29, as well as the instruction decoder 15, CAM array 20, almost full flag logic circuit 30, and full flag logic circuit 40. Addresses (ADDR) provided to CAM architecture 50 are stored in the address register 24 or may be directly provided to the full flag logic 40. The priority encoder 27 generates the next free address (NFA) and provides the NFA to the NFA register 25. The NFA is the numerically lowest available CAM address. That is, the NFA is the numerically lowest CAM address that has its corresponding valid bit de-asserted. For other embodiments, the NFA may be the numerically highest available CAM address, or any other predetermined priority address. The NFA may be generated in any well-known manner by priority encoder 27. The MUX 28 includes a first input terminal coupled to the address register 24, a second input terminal coupled to the NFA register 25, an output terminal coupled to the address decoder 29, and a control terminal coupled to the instruction decoder 15. In other embodiments, MUX 28 may be placed between decoder 29 and CAM array 20. In still other embodiments, MUX 28 may be incorporated into decoder 29.

The instruction decoder 15 decodes instructions received from the IBUS and, in response thereto, provides a control signal CTRL to the MUX 28, and also provides the Ibits to the full flag logic circuit 40 and CAM array 20. The control signal CTRL selects whether an address ADDR stored in the address register 24 or the NFA stored in the NFA register 25 is provided to the decoder 29 and CAM array 20 for well-known reading, writing, and invalidating operations.

The full flag logic circuit 40 generates the FF in response to the AFF, the Ibits, and one or more of NFA and the address ADDR. The full flag logic circuit 40 monitors the ADDR, the NFA, and the Ibits to determine whether a subsequent instruction calls for writing valid data to the last available CAM row. When the AFF is asserted, indicating that there is only one available row in the CAM array 20, the NFA identifies the last available row in the CAM array 20. Therefore, the FF is asserted when the Ibits indicate a write operation to the NFA. Also, the FF is asserted when the Ibits indicate a write operation to a specified ADDR that matches the NFA.

Figure 6:
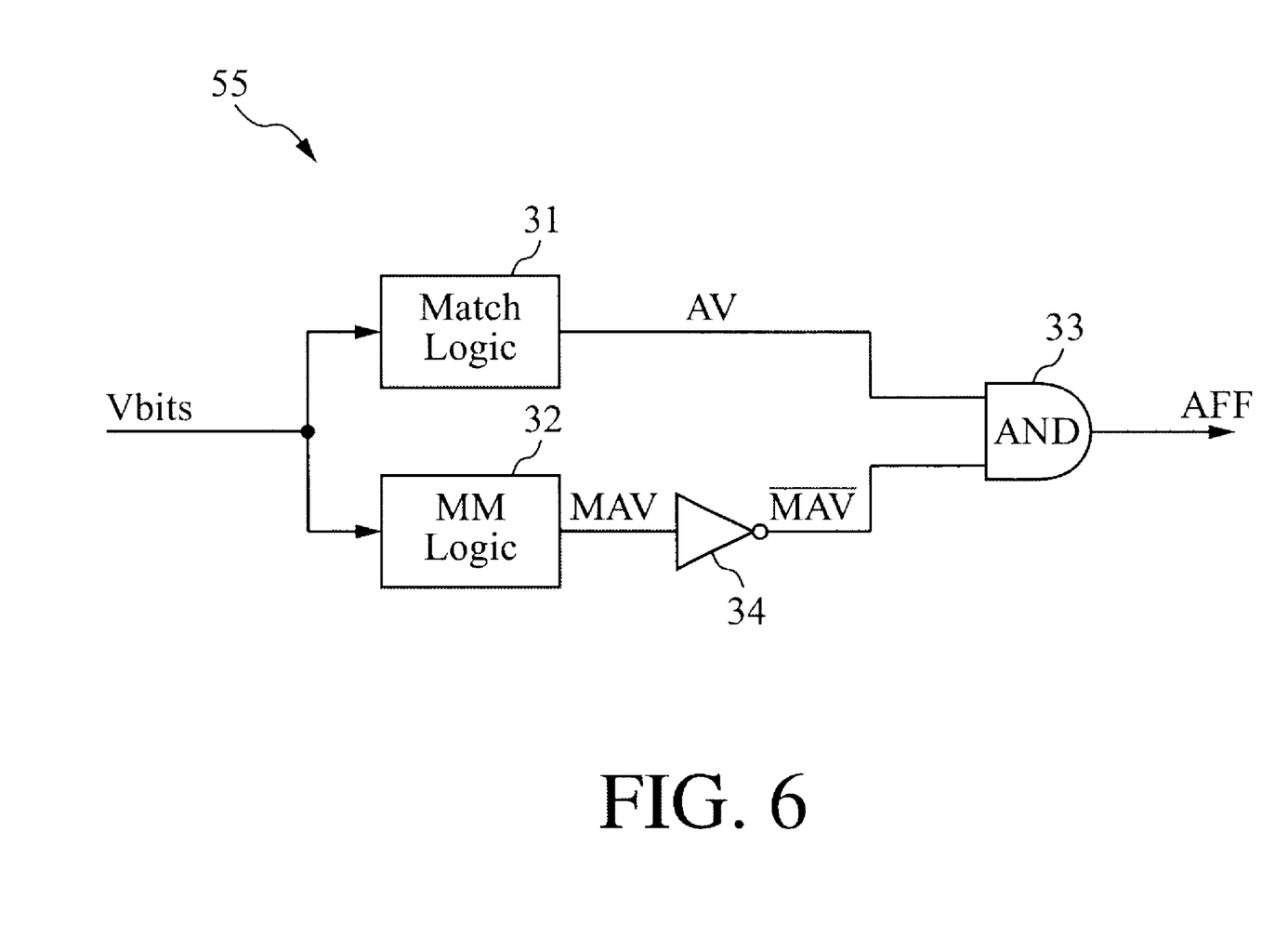
FIG. 6 is a block diagram of the almost full flag logic circuit according to one embodiment of the CAM of FIG. 5.

FIG. 6 shows an almost full flag logic circuit 55 that is one embodiment of the almost full flag logic circuit 30 of FIGS. 3 and 5. Other embodiments may be used. Almost full flag logic circuit 55 includes match logic 31 and multiple match logic 32, each of which has input terminals coupled to receive the Vbits. The match logic 31 may be any well-known match logic circuit configured to determine whether any of the Vbits are de-asserted (e.g., logic low indicating that there is at least one available row). If at least one of the Vbits is de-asserted, the match logic 31 asserts at its output terminal a first signal AV to a logic high state to indicate that there is at least one available row in the CAM array 20. The multiple match logic 32 may be any well-known multiple match logic circuit configured to determine whether more than one of the Vbits are de-asserted. In some embodiments, the multiple match logic 32 may be of the type disclosed in the co-pending U.S. patent application Ser. No. 09/351,962 entitled "Method of Detecting Multiple Matches in a Content Addressable Memory," now issued as U.S. Pat. No. 6,175,513, incorporated herein by reference. Thus, if more than one of the Vbits are de-asserted, the multiple match logic 32 asserts at its output terminal a second signal MAV to logic high to indicate that there is more than one available row in the CAM array 20. The second signal MAV is de-asserted to logic low when there is no longer more than one available row in the CAM array 20. The second signal MAV is logically inverted by an inverter 34 to provide a complementary signal $\overline{\text{MAV}}$, which is combined with the first signal AV in an AND gate 33 to generate the AFF. The AFF is asserted to logic high when the first signal AV is asserted to logic high indicating that there is at least one available row and the second signal MAV is de-asserted to logic low (and thus complementary signal $\overline{\text{MAV}}$ is asserted to logic high) indicating that there is not more than one available row.

In some embodiments, the logical inversion of the inverter 34 may be implemented within the multiple match logic circuit 32. In other embodiments, the logic levels of signals AV and MAV, as well as signal flags AFF and FF, may be reversed. For another embodiment, match logic 31 and multiple match logic 32 may be included within priority encoder 27 to provide the signals AV and MAV.

For an alternate embodiment, match logic 31 and AND gate 33 may be omitted from almost full flag logic circuit 55 (inverter 34 may also be optionally omitted). In this embodiment, the AFF signal is determined when the MAV signal indicates that there is not more than one available CAM location in CAM array 20 (i.e., MAV low). Thus, AFF will be asserted when CAM array 20 is one location from being full, or is full. AFF may then be logically combined with one or more Ibits by full flag logic circuit 40 to generate FF. For one embodiment, full flag logic 40 may include an AND gate that logically combines $\overline{\text{MAV}}$ and a valid high Ibit indicating a write instruction to assert FF. In other embodiments, one or more AND, OR, XOR, inverters, complex logic gates may be used.

Figure 7:
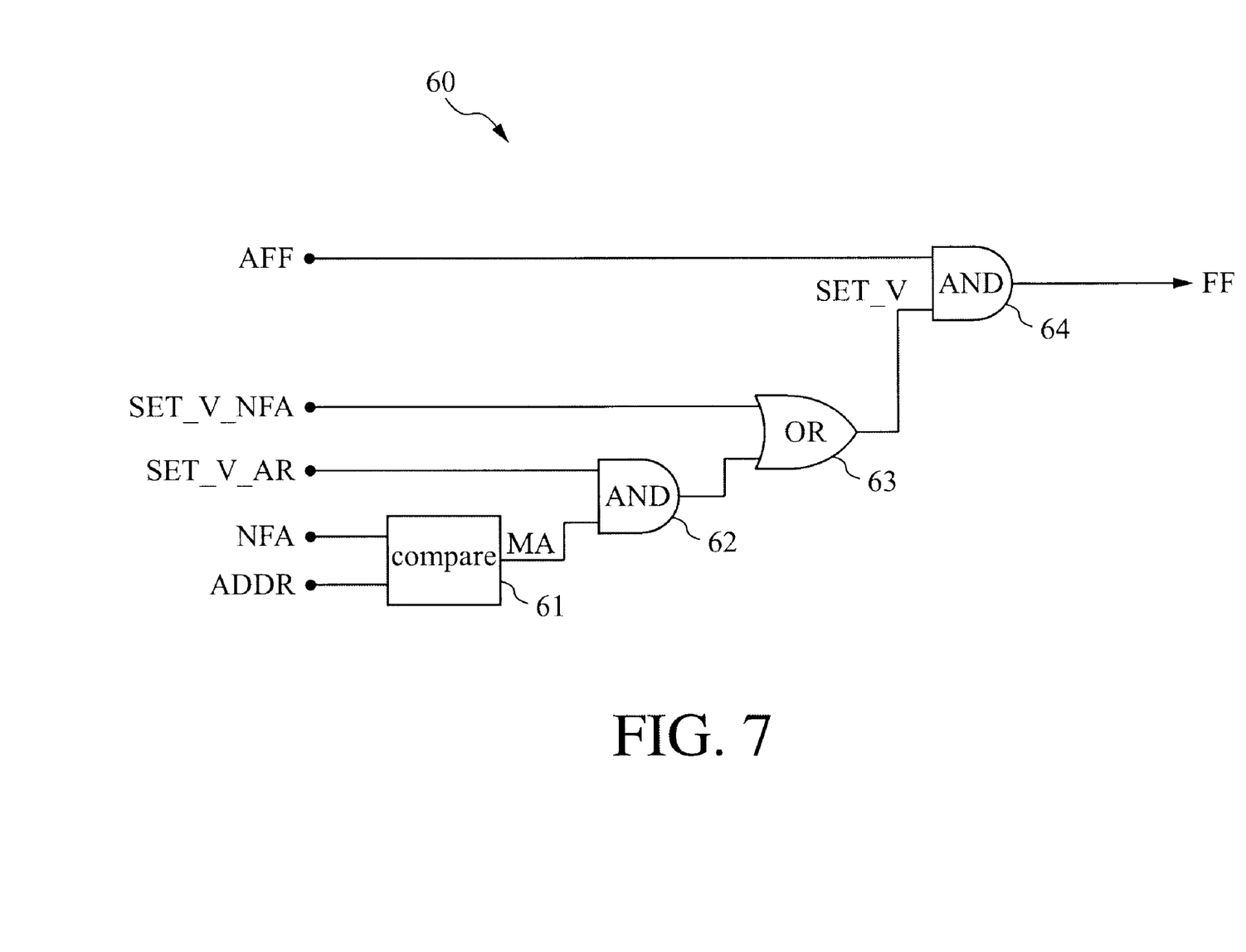
FIG. 7 is a circuit diagram of the full flag logic circuit according to one embodiment of the CAM of FIG. 5.

FIG. 7 shows a gate level schematic of a full flag logic circuit 60 that is one embodiment of the full flag logic circuit 40 of FIG. 6. Other embodiments may be used. Here, the Ibits provided by the instruction decoder (see also FIG. 5) include active high signals SET_V_AR and SET_V_NFA. The SET_V_AR signal asserts the Vbit corresponding to the CAM address stored in the address register 24 (i.e., the ADDR), and is asserted for instructions which cause valid data to be written to the specified address ADDR of CAM array 20. The SET_V_NFA signal asserts the Vbit corresponding to the CAM address stored in the NFA register 25 (i.e., the NFA), and is asserted for instructions which cause valid data to be written to the NFA in CAM array 20.

Any well-known compare circuit 61 compares the ADDR with the NFA to generate a matching address signal MA which, when logic high, indicates that the ADDR stored in the address register 24 matches the NFA stored in the NFA register 25. The matching address signal MA and the Ibit SET_V_AR are logically combined in an AND gate 62, the output signal of which is combined with the Ibit SET_V_NFA in an OR gate 63 to generate a set valid signal SET_V. The almost full flag AFF and the set valid signal SET_V are logically combined in an AND gate 64 to generate the FF.

Referring to FIGS. 3, 5 and 7, if after the AFF is asserted to a high state a subsequent instruction calls for writing data to the next free address NFA, the Ibit SET_V_NFA is asserted by the instruction decoder 15 (FIGS. 3 and 5). The logic high state of the Ibit SET_V_NFA propagates through the OR gate 63 and is logically combined with the AFF by AND gate 64 which asserts the FF to a logic high state (FIG. 4). The NFA is also provided to the CAM array 20, and data is written to the corresponding last available row (FIGS. 3 and 5).

Referring to FIG. 7, if the subsequent instruction calls for writing data to a specified address ADDR stored in the address register 24, the Ibit SET_V_AR is asserted. Here, the FF is asserted only if the specified address ADDR matches the last free address NFA. Thus, the compare circuit 61 compares the ADDR stored in the address register 24 with the NFA stored in the NFA register 25 to determine if the instruction calls for writing valid data to the last available address. Accordingly, if the addresses match, the matching address signal MA goes to logic high and propagates through the AND gate 62 and the OR gate 63, and is then combined by the AND gate 64 to assert the FF.

If, on the other hand, the respective addresses ADDR and NFA do not match, i.e., the specified address ADDR does not point to the last available address, the compare circuit 61 drives its output signal MA to logic low which, in turn, forces the output terminal of the AND gate 62 to logic low. Here, the de-asserted, logic low Ibit SET_V_NFA forces the output terminal of the OR gate 63 to logic low. In response thereto, the output terminal of the AND gate 64 remains logic low, leaving the FF de-asserted to a logic low state to indicate that the CAM array 40 still has at least one available row.

Figure 8:
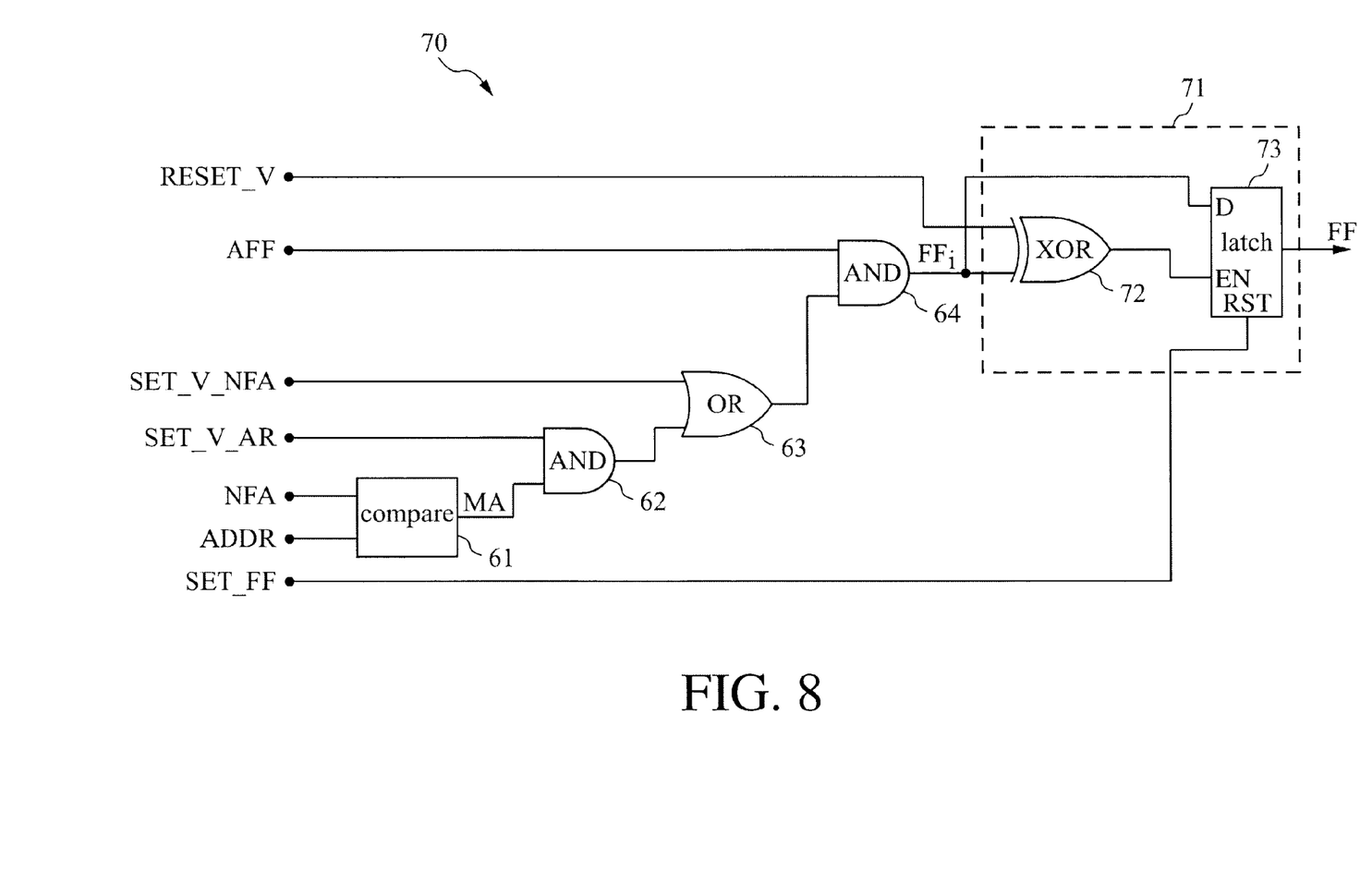
FIG. 8 is a circuit diagram of the full flag logic circuit according to another embodiment of the CAM of FIG. 5.

FIG. 8 shows a full flag logic circuit 70 that is another embodiment of the full flag logic circuit 40 of FIG. 5. Here, a logic circuit 71 is coupled to the output terminal of the AND gate 64 to allow for direct control of the FF using control signals RESET_V and/or SET_FF. The logic circuit 71 includes an XOR gate 72 having a first input terminal coupled to the output terminal of the AND gate 64 and the data input D of a D-type latch 73, a second input terminal coupled to receive signal RESET_V, and an output terminal coupled to the enable terminal (EN) of the latch 73. The Ibit signal SET_FF is an active high logic signal which asserts the FF by resetting the latch 73.

The signal RESET_V is an active high logic signal that may be used by instructions to invalidate a CAM row or otherwise makes one of the CAM rows available that was previously unavailable. These instructions may be accompanied by an erase or invalidation operation. The intermediate full flag signal FFi output by AND gate 64 is asserted to a logic high state when there is a full condition in CAM array 20. In this embodiment, the control signals SET_V_NFA and SET_V_AR are only set to high states during the respective clock cycles of the instruction that caused one of these control signals to be asserted. RESET_V will be low during this time. Thus, FFi will only be asserted during the clock cycle(s) in which an instruction causes the CAM array 20 become full. The logic state of FFi is latched by latch 73 to hold the state of FF after FFi is de-asserted at the end of the clock cycle. When a subsequent instruction invalidates a row in CAM array 20, RESET_V is asserted. This causes XOR gate 72 to enable latch 73 to provide the new low state of FFi to FF to indicate that CAM array 20 is no longer full.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention. In particular, the logic levels associated with the Vbits, the AFF, the FF, and other signals may be reversed according to desired operating characteristics without departing from the scope of the invention.

What is claimed is:

1. A method for generating a full flag indicating that an associated content addressable memory (CAM) array is full, the CAM array having associated therewith a plurality of valid bits each indicative of whether a corresponding row of the CAM array contains valid data, the method comprising:

asserting an almost full flag when the valid bits indicate that all but one of the corresponding rows of the CAM array contain valid data; and asserting the full flag when a subsequent instruction results in the valid bits indicating that all of the corresponding rows of the CAM array contain valid data.

2. The method of claim 1, wherein the full flag is asserted in response to the subsequent instruction which causes valid data to be written to the but one row of the CAM array which does not contain valid data.

3. The method of claim 1, wherein asserting the almost full flag further comprises:

asserting a first signal when the valid bits indicate that at least one of the rows of the CAM array contains invalid data;

de-asserting a second signal when the valid bits indicate that not more than one of the rows of the CAM array contain invalid data; and logically combining the first and second signals.

4. The method of claim 3, wherein the first signal is generated by a match circuit and the second signal is generated by a multiple match circuit.

5. The method of claim 1, wherein asserting the full flag further comprises determining whether the subsequent instruction calls for writing data to a next free address of the CAM array.

6. The method of claim 1, wherein asserting the full flag further comprises:

detecting whether the subsequent instruction calls for writing data to a specified address;

comparing the specified address to a next free address of the CAM array; and asserting the full flag if the specified address matches the next free address.

7. A full flag logic structure for generating a full flag when an instruction calls for writing valid data to the last available row of an associated content addressable memory (CAM) array, the structure comprising:

an almost full flag logic circuit having an input coupled to receive valid bits from the CAM array and having an output terminal, the valid bits indicative of whether a corresponding row of the CAM array contains valid data; and a full flag logic circuit having a first input terminal coupled to the output terminal of the almost full flag logic circuit, a second input terminal coupled to receive an instruction bit from an associated instruction decoder, and an output terminal to provide the full flag.

8. The structure of claim 7, wherein the full flag logic circuit further comprises a third input terminal coupled to receive a next free address of the array.

9. The structure of claim 7, wherein the full flag logic circuit is coupled to receive an address specified for the instruction.

10. The structure of claim 7, wherein the almost full flag circuit further comprises:

a match logic circuit having an input coupled to receive the valid bits and having an output terminal;

a multiple match circuit having an input coupled to receive the valid bits and having an output terminal; and a logic circuit having first and second input terminals coupled to the respective output terminals of the match logic circuit and the multiple match logic circuit, and having an output terminal to provide an almost full flag.

11. The structure of claim 10, wherein the match logic circuit asserts a first signal when the valid bits indicate that at least one of the rows of the CAM array contains invalid data.

12. The structure of claim 11, wherein the multiple match logic circuit de-asserts a second signal when the valid bits indicate that not more than one of the rows of the CAM array contain invalid data.

13. The structure of claim 10, wherein the match logic circuit and the multiple match logic circuit are included within a priority encoder associated with the CAM array.

14. The structure of claim 8, wherein the full flag logic circuit further comprises:

a comparator having a first input coupled to receive the next free address, a second input for receiving an address specified for the instruction, and an output terminal;

a first logic circuit having a first input terminal coupled to receive a first of the instruction bits, a second input terminal coupled to the output terminal of the comparator, and a output terminal;

a second logic circuit having a first input terminal coupled to receive a second of the instruction bits, a second input terminal coupled to the output terminal of the first logic circuit, and an output terminal; and a third logic circuit having a first input terminal coupled to the output terminal of the almost full flag logic circuit, a second input terminal coupled to the output terminal of the second logic circuit, and an output terminal to provide the full flag.

15. The structure of claim 14, wherein the first logic circuit comprises an AND gate, the second logic circuit comprises an OR gate, and the third logic circuit comprises an AND gate.

16. The structure of claim 14, further comprising a fourth logic circuit coupled to the output terminal of the third logic circuit.

17. The structure of claim 16, wherein the fourth logic circuit comprises:

an exclusive-OR gate having a first input terminal coupled to the output terminal of the third logic circuit, a second input terminal, and an output terminal; and a latch having a data input terminal coupled to the first input terminal of the exclusive-OR gate, an enable terminal coupled to the output terminal of the exclusive OR gate, and an output terminal coupled to provide the full flag.

18. The structure of claim 7, wherein the almost full flag logic circuit comprises a multiple match circuit having an input to receive the valid bits and having an output terminal coupled to the full flag circuit, the multiple match circuit to assert an almost full flag when the valid bits indicate that not more than one of the rows of the CAM array contains invalid data.

19. A full flag logic structure for generating a full flag when an associated content addressable memory (CAM) array is full, the CAM array having associated therewith a plurality of valid bits each indicative of whether a corresponding row of the CAM array contains valid data, the structure comprising:

means for asserting an almost full flag when the valid bits indicate that all but one of the corresponding rows of the CAM array contain valid data; and means for asserting the full flag when an instruction provided to the CAM array calls for writing valid data to the last available row of the CAM array.

20. The structure of claim 19, wherein the means for asserting the almost full flag further comprises:

means for asserting a first signal when the valid bits indicate that at least one of the rows of the CAM array contains invalid data;

means for de-asserting a second signal when the valid bits indicate that not more than one of the rows of the CAM array contains invalid data; and a logic circuit configured to combine the first and second signals to provide the almost full flag.

21. The structure of claim 19, wherein the means for asserting the full flag further comprises:

means for monitoring one or more instruction bits to determine if the instruction calls for writing valid data to the one row of the CAM array which does not contain valid data.

22. The structure of claim 21, wherein the means for monitoring comprises means for determining whether the instruction calls for assertion of the valid bit of a next free address of the CAM array.

23. The structure of claim 21, wherein the means for monitoring comprises:

means for detecting whether the instruction calls for writing data to a specified address;

means for comparing the specified address to a next free address of the CAM array; and means for asserting the full flag if the specified address matches the next free address.

24. A method for generating an almost full flag for a content addressable memory (CAM) array, the CAM array having associated therewith a plurality of valid bits each indicative of whether a corresponding row of the CAM array contains valid data, the method comprising:

logically monitoring the valid bits; and determining that only one of the rows of the CAM array contains invalid data.

25. The method of claim 24, wherein determining that only one of the rows of the CAM array contains invalid data further comprises:

asserting a first signal when the valid bits indicate that at least one of the rows of the CAM array contains invalid data;

de-asserting a second signal when the valid bits indicate that not more than one of the rows of the CAM array contain invalid data; and logically combining the first and second signals.

26. An almost full flag logic circuit for generating an almost full flag for a content addressable memory (CAM) array, the CAM array having associated therewith a plurality of valid bits each indicative of whether a corresponding row of the CAM array contains valid data, the circuit comprising:

a match logic circuit having an input coupled to receive the valid bits and having an output terminal;

a multiple match logic circuit having an input coupled to receive the valid bits and having an output terminal; and a logic circuit having first and second input terminals coupled to the respective output terminals of the match logic circuit and the multiple match logic circuit, and having an output terminal to provide the almost full flag.

27. The circuit of claim 26, wherein the match logic circuit asserts a first signal when the valid bits indicate that at least one of the rows of the CAM array contains invalid data.

28. The circuit of claim 26, wherein the multiple match logic circuit asserts a second signal when the valid bits indicate that more than one of the rows of the CAM array contain invalid data.

29. A content addressable memory (CAM) structure comprising:

a CAM array having a plurality of rows of CAM cells and a plurality of valid bits corresponding to the rows of CAM cells;

an instruction decoder coupled to the CAM array;

almost full flag logic coupled to the CAM array to receive at least one of the valid bits, and having an output to provide an almost full flag signal; and full flag logic having a first input coupled to receive the almost full flag signal, a second input coupled to the instruction decoder, and having an output to provide a full flag signal.

30. The structure of claim 29, wherein the almost full flag logic asserts the almost full flag signal when the valid bits indicate that not more than one of the rows of the CAM array contains invalid data.

31. The structure of claim 29, wherein the full flag logic asserts the full flag signal when one or more instruction bits received from the instruction decoder indicate that valid data is to be written to the last available row of the CAM array.

32. The structure of claim 29, wherein the almost full flag logic comprises:

a match logic circuit having an input coupled to receive the valid bits and having an output terminal;

a multiple match logic circuit having an input coupled to receive the valid bits and having an output terminal; and a logic circuit having first and second input terminals coupled to the respective output terminals of the match logic circuit and the multiple match logic circuit, and having an output terminal to provide the almost full flag signal.

33. The structure of claim 29, wherein the almost full flag logic comprises a multiple match logic circuit having an input coupled to receive the valid bits and having an output terminal to provide the almost full flag signal.

34. The structure of claim 29, wherein the almost full flag logic comprises:

means for asserting the almost full flag signal when the valid bits indicate that all but one of the corresponding rows of the CAM array contain valid data.

35. The structure of claim 34, wherein the means for asserting the almost full flag signal further comprises:

means for asserting a first signal when the valid bits indicate that at least one of the rows of the CAM array contains invalid data;

means for de-asserting a second signal when the valid bits indicate that not more than one of the rows of the CAM array contains invalid data; and a logic circuit configured to combine the first and second signals to provide the almost full flag signal.

36. The structure of claim 29, wherein the full flag logic comprises:

means for asserting the full flag signal when an instruction provided to the CAM array calls for writing valid data to the last available row of the CAM array.

37. The structure of claim 36, wherein the means for asserting the full flag signal further comprises:

means for monitoring one or more instruction bits to determine if the instruction calls for writing valid data to the one row of the CAM array which does not contain valid data.

38. The structure of claim 37, wherein the means for monitoring comprises means for determining whether the instruction calls for assertion of the valid bit of a next free address of the CAM array.

* * * * *